(12) United States Patent
Gangopadhyay et al.

(10) Patent No.: US 8,872,688 B2
(45) Date of Patent: Oct. 28, 2014

(54) METHODS AND SYSTEMS FOR COMPRESSED SENSING ANALOG TO DIGITAL CONVERSION

(75) Inventors: Daibashish Gangopadhyay, Mountain View, CA (US); David Allstot, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 0 days.

(21) Appl. No.: 13/810,036

(22) PCT Filed: Jul. 13, 2011

(86) PCT No.: PCT/US2011/043817
§ 371 (c)(1),
(2), (4) Date: Mar. 11, 2013

(87) PCT Pub. No.: WO2012/009413
PCT Pub. Date: Jan. 19, 2012

(65) Prior Publication Data
US 2013/0162457 A1 Jun. 27, 2013

Related U.S. Application Data

(60) Provisional application No. 61/363,944, filed on Jul. 13, 2010.

(51) Int. Cl.
*H03M 1/12* (2006.01)
*H03M 1/38* (2006.01)
(52) U.S. Cl.
CPC ............. *H03M 1/1245* (2013.01); *H03M 1/38* (2013.01)
USPC .......................................... 341/155; 341/122

(58) Field of Classification Search
USPC .................. 341/155, 122, 143, 118, 120, 163
See application file for complete search history.

(56) References Cited

U.S. PATENT DOCUMENTS 7,015,841 B2 * 3/2006 Yoshida et al. ............... 341/120
7,345,603 B1 3/2008 Wood et al.
(Continued)

OTHER PUBLICATIONS

National Center for Health Statistics. Health, United States, 2009: With Special Feature on Medical Technology. Hyattsville, MD 2010 <http://www.cdc.gov/nchs/data/hus/hus09.pdf#highlights>.

(Continued)

*Primary Examiner* — Peguy Jean Pierre
(74) *Attorney, Agent, or Firm* — McDonnell Boehnen Hulbert & Berghoff LLP

(57) ABSTRACT

Disclosed herein are example methods, systems, and devices for compressed sensing analog to digital conversion. In an example embodiment, a multiplication circuit is configured to multiply an input signal with a measurement signal to produce a multiplied signal, where the measurement signal includes data from a column of a measurement matrix. The measurement matrix may be generated by a linear feedback shift register (LFSR)-based measurement-matrix generator. An integration circuit may be coupled to the multiplication circuit and configured to integrate the multiplied signal for a predefined amount of time to produce an integrated signal. An analog to digital converter (ADC) circuit may be coupled to the integration circuit and configured to (i) sample the integrated signal and (ii) produce an output signal comprising at least one sample of the integrated signal. A column-wise multiplication of the input signal with the measurement signal enables an efficient compressed-sensing analog-to-digital conversion architecture.

22 Claims, 10 Drawing Sheets

(56) References Cited

U.S. PATENT DOCUMENTS

| | | | |
|---|---|---|---|
| 7,592,939 B1* | 9/2009 | Cruz-Albrecht et al. | 341/144 |
| 7,834,795 B1 | 11/2010 | Dudgeon et al. | |
| 7,903,018 B2* | 3/2011 | Schatzberger et al. | 341/172 |
| 7,944,387 B2* | 5/2011 | Ohnhaeuser et al. | 341/172 |
| 7,965,216 B1* | 6/2011 | Petre et al. | 341/155 |
| 2009/0222226 A1 | 9/2009 | Baraniuk et al. | |
| 2013/0076553 A1* | 3/2013 | Kuo et al. | 341/172 |
| 2013/0236112 A1* | 9/2013 | Oka et al. | 382/232 |

OTHER PUBLICATIONS

E. Candès, et al., "An Introduction to Compressive Sampling," IEEE Signal Proc. Mag., vol. 25, pp. 21-30, Mar. 2008.

M.S. Chae, et al., "Design Optimization for Integrated Neural Recording Systems," IEEE J. Solid-State Circuits, vol. 43, pp. 1931-1939, Sep. 2008.

R. Yazicioglu, et al., "A 30uW Analog Signal Processor ASIC for Biomedical Signal Monitoring," IEEE ISSCC, 2010, pp. 124-125.

D. Needell, et al., "Signal Recovery From Incomplete and Inaccurate Measurements Via Regularized Orthogonal Matching Pursuit," IEEE J. Selected Topics in Signal Processing, vol. 4, No. 2, pp. 1-7, 2010.

C. C. Enz and G. C. Temes, "Circuit Techniques for Reducing the Effects of Op-Amp Imperfections: Autozeroing, Correlated Double Sampling, and Chopper Stabilization," Proc. of IEEE, vol. 84, No. 11, pp. 1584-1614, Nov. 1996.

R. F. Yazicioglu et. al. "Low-Power Low-Noise 8-Channel EEG Front-End ASIC for Ambulatory Acquisition Systems," Proc. of European Solid-State Circuits Conf., pp. 247-250, Sep. 2006.

I. McGregor et. al. "Sub-50μW, 2.4 GHz Super-Regenerative Transceiver with Ultra Low Duty Cycle and a 675μW High Impedance Super-Regenerative Receiver," Proceedings of the 37th European Microwave Conference, pp. 1322-1325, Oct. 2007.

B. Schell and Y.Tsividis, "A Continuous-Time ADC/DSP/DAC System with no Clock and with Activity-Dependent Power Dissipation" IEEE J. of Solid State Circuits, vol. 43, No. 11 pp. 2472-2481, Nov. 2008.

F. Colodro and A. Torralba, "Multirate Sigma-Delta Modulators", IEEE Trans. Circuits & Syst. II: Analog and Digital Signal Processing, vol. 49, No. 3, pp. 170-176, Mar. 2002.

E. Alpman et al., "A 1.1V 50mW 2.5GS/s 7b Time-Interleaved C-2C SAR ADC in 45nm LP Digital CMOS," Proc. of the Int. Solid State Circuits Conf., pp. 76-77, Feb. 2009.

M. S. J. Steyaert et al., "A Micropower Low-Noise Monolithic Instrumentation Amplifier for Medical Purposes," IEEE J. Solid-State Circuits, vol. sc-22, No. 6, pp. 1163-1168, Dec. 1987.

American National Standards for Cardiac Monitors, Hearth Rate Meters and Alarms, ANSI/AAMI EC13, 2002.

R. F. Yazicioglu et al., "A 60 μW 60 nV/√Hz, Readout Front-End for Portable Biopotential Acquisition Systems," in IEEE ISSCC Dig. Tech. Papers, Feb. 2006, pp. 56-57.

M. R. Nuwer et al., "IFCN Standards for Digital Recording of Clinical EEG," Electroencephalography and clinical Neurophysiology, vol. 106, No. 3, pp. 259-261, Mar. 1998.

T. Denison et al., "A 2.2μW 94nV/√Hz, Chopper-Stabilized Instrumentation Amplifier for EEG Detection in Chronic Implants," ISSCC Dig. Tech. Papers, pp. 162-163, 2007.

R. F. Yazicioglu et al., "A 200 μW Eight-Channel EEG Acquisition ASIC for Ambulatory EEG Systems," IEEE J. Solid-State Circuits, vol. 43, No. 12, pp. 3025-3038, Dec. 2008.

E. Candès and Terence Tao, "Decoding by Linear Programming," IEEE Trans. on Information Theory, vol. 51, No. 12, pp. 4203-4215, Dec. 2005.

D. L. Donoho, "For Most Large Underdetermined Systems of Linear Equations, the Minimal l-1norm Solution is Also the Sparsest Solution," Communications on Pure and Applied Mathematics, vol. 59, No. 6, pp. 797-829, Jun. 2006.

E .Candès et al., "Stable Signal Recovery from Incomplete and Inaccurate Measurements," Communications on Pure and Applied Mathematics, vol. 59, No. 8, pp. 1207-1223, Aug. 2006.

P. K. Baheti et al., "An Ultra Low Power Pulse Oximeter Sensor Based on Compressed Sensing," Sixth International Workshop on Wearable and Implantable Body Sensor Networks, Jun. 3-5, 2009, pp. 144-148.

F. Chen et al., "A Signal-agnostic Compressed Sensing Acquisition System for Wireless and Implantable Sensors," Custom Integrated Circuits Conference (CICO), 2010 IEEE , pp. 1-4, Sep. 19-22, 2010.

D. L. Donoho, "Compressed Sensing," IEEE Transactions on Information Theory, vol. 52, No. 4, pp. 1289-1306, Apr. 2006.

J. N. Laska et al., "Theory and Implementation of an Analog-to-Information Converter using Random Demodulation," Proceedings of IEEE International Symposium on Circuits and Systems (ISCAS), pp. 1959-1962, May 27-30, 2007.

J. Romberg and M. Wakin, "Compressed Sensing: A Tutorial," IEEE Statistical Signal Processing Workshop, Madison, Wisconsin, Aug. 26, 2007 <http://people.ee.duke.edu/~willett/SSP//Tutorials/ssp07-cs-tutorial.pdf>.

* cited by examiner

METHODS AND SYSTEMS FOR COMPRESSED SENSING ANALOG TO DIGITAL CONVERSION

RELATED APPLICATIONS

This application is a U.S. National Phase of International Application No. PCT/US11/43817 filed on Jul. 13, 2011, which claims priority to U.S. Provisional Patent Application Ser. No. 61/363,944 filed Jul. 13, 2010, entitled Compressed Sensing Analog-to-Digital Converters for Biomedical Applications, the disclosures of which are incorporated herein in their entirety.

STATEMENT OF U.S. GOVERNMENT INTEREST

This invention was made with U.S. Government support under grant number ECCS-0951368 awarded by the National Science Foundation. The U.S. Government has certain rights in the invention.

BACKGROUND

Common approaches to data compression involve sampling, digitizing, and then compressing a data signal. Such approaches often include Nyquist sampling of the data signal, whereby the data signal is sampled at least twice as fast as the data signal's maximum rate of change. However, for data signals that are characterized by a high degree of data redundancy (i.e., signals exhibiting a significant degree of difference between the rate of change of a relatively sparse signal and the rate of information in it), such common approaches to data compression may be inefficient or otherwise undesirable. Examples of data signals that may exhibit high degrees of data redundancy include, but are not limited to, bio-signals, industrial signals, computer-processing signals, audio-recording signals, and video-recording signals, among others.

Compressed sensing involves an approach to sampling of a data signal that does not necessarily require sampling of the data signal at the Nyquist rate. Compressed-sensing techniques utilize the insight that a sparse signal may be sampled at a much lower rate than the Nyquist rate, and may still be accurately recovered using post-processing in hardware or software. As such, the power consumption and complexity of a signal-acquisition system may be reduced using compressed sensing.

The theoretical framework of compressed sensing is based on the matrix equation $[Y]=[\Phi][X]$; i.e., an uncompressed input signal (vector $[X]$) of size N, is multiplied by a measurement matrix $[\Phi]$ of size M×N to obtain a compressed output signal (vector $[Y]$) of size M<N. Because $[\Phi]$ is non-invertible (i.e., not a square matrix), various algorithms may then be applied to $[Y]$ in an attempt to search for the right $[X]$ from several possible solutions. Such algorithms may exploit the sparsity of the data signal for high accuracy of recovery.

One possible implementation of such compressed-sensing techniques involves the multiplication of each row of $[\Phi]$ by the input signal (vector $[X]$). For various reasons, there are a number of limitations to this approach. Such limitations include, for example, potential inaccuracy and imprecision, power inefficiency, long delays, and large circuit areas.

An improvement is therefore desired.

SUMMARY OF THE INVENTION

Disclosed herein are methods, systems, and devices that allow for efficient compressed sensing analog-to-digital (A/D) conversion. One source of such efficient compressed sensing in the present disclosure is a column-by-column multiplication of the measurement matrix $[\Phi]$ by the input signal (vector $[X]$).

The methods, systems, and devices described herein may be applicable to a wide-variety of signal-acquisition applications. Such applications include, but are not limited to, the acquisition of signals characterized by data redundancy arising from a significant degree of difference between the rate of change of a relatively sparse signal and the rate of information in it.

In one aspect, an example circuit may include a multiplication circuit configured to multiply an input signal with a measurement signal to produce a multiplied signal, where the measurement signal includes data from a column of a measurement matrix; an integration circuit coupled to the multiplication circuit configured to integrate the multiplied signal for a predefined amount of time to produce an integrated signal; and an analog to digital converter (ADC) circuit coupled to the integration circuit and configured to (i) sample the integrated signal and (ii) produce an output signal comprising at least one sample of the integrated signal.

The input signal may include a differential-input signal having a positive-input signal and a negative-input signal. Accordingly, the multiplication circuit may include a differential-signal selection circuit having a switch configured to select one of the positive-input signal and the negative-input signal based at least in part on the measurement signal. The multiplication circuit may further include an analysis circuit including a plurality of stages, each stage including: a selection circuit configured to select, based at least in part on the measurement signal, one of (a) the selected one of the positive-input signal and the negative-input signal and (b) a virtual-ground signal; and a storage element having (a) a first terminal configured to receive the signal selected by the selection circuit and (b) a second terminal configured to output a selected-output signal; and a combination circuit configured to combine the selected-output signals of the plurality of stages and thereby generate the multiplied signal.

The integration circuit may include an operational-amplifier circuit including: a first input configured to receive the multiplied signal; a second input configured to receive the virtual-ground signal; and an output coupled to a first feedback path connected to the first input and a second feedback path connected to the first input, where the first feedback path includes a first-feedback switch, and where the second feedback path includes a second-feedback switch, a feedback capacitor, and a reset switch.

The ADC circuit may include: a successive approximation register (SAR)-logic circuit configured to output a selection signal; a sampling circuit including a plurality of stages, each stage including: a selection circuit configured to select, based at least in part on the selection signal, one of (a) the integrated signal, (b) a direct-current signal, and (c) a ground signal; and a storage element having (a) a first terminal configured to receive the signal selected by the selection circuit and (b) a second terminal configured to output a selected-output signal; and a combination circuit configured to combine the selected-output signals of the plurality of stages and thereby generate a combined-output signal.

In another aspect, an example circuit may include: a set of analog to digital converter (ADC) circuits, where each ADC circuit is coupled to a respective integration circuit, and where each integration circuit is coupled to a respective multiplication circuit; a sampling buffer configured to receive, from each ADC circuit in a sequential manner, a respective output signal; a successive approximation register (SAR)-logic circuit configured to output a selection signal; a sampling circuit including a plurality of stages, each stage including: a selection circuit configured to select, based at least in part on the selection signal, one of (a) the integrated signal, (b) a direct-current signal, and (c) a ground signal; and a storage element having (a) a first terminal configured to receive the signal selected by the selection circuit and (b) a second terminal configured to output a selected-output signal; and a combination circuit configured to combine the selected-output signals of the plurality of stages and thereby generate a combined-output signal.

In another aspect, an example circuit may include: a first input configured to receive an input signal; a second input configured to receive a virtual-ground signal; a successive approximation register (SAR)-logic circuit; and an output coupled to a first feedback path connected to the first input, where the first feedback path includes: a first sub-integration circuit including a plurality of stages, each stage configured to provide a first-sub-integration selected-output signal; and a first combination circuit configured to combine the first-sub-integration selected-output signals of the plurality of stages and thereby generate a first combined-output signal; and an output coupled to a second feedback path connected to the first input, where the second feedback path includes: a second sub-integration circuit comprising a plurality of stages, each stage configured to provide a second-sub-integration selected-output signal; and a second combination circuit configured to combine the second-sub-integration selected-output signals of the plurality of stages and thereby generate a second combined-output signal.

In another aspect, an example method may include: multiplying an input signal with a measurement signal to produce a multiplied signal, where the measurement signal includes data from a column of a measurement matrix; integrating the multiplied signal for a predefined amount of time to produce an integrated signal; sampling the integrated signal; and producing an output signal comprising at least one sample of the integrated signal.

These as well as other aspects and advantages will become apparent to those of ordinary skill in the art by reading the following detailed description, with reference where appropriate to the accompanying drawings.

DETAILED DESCRIPTION

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. EXAMPLE ARCHITECTURE a. Signal-Transmission Systems Generally

Figure 1A:
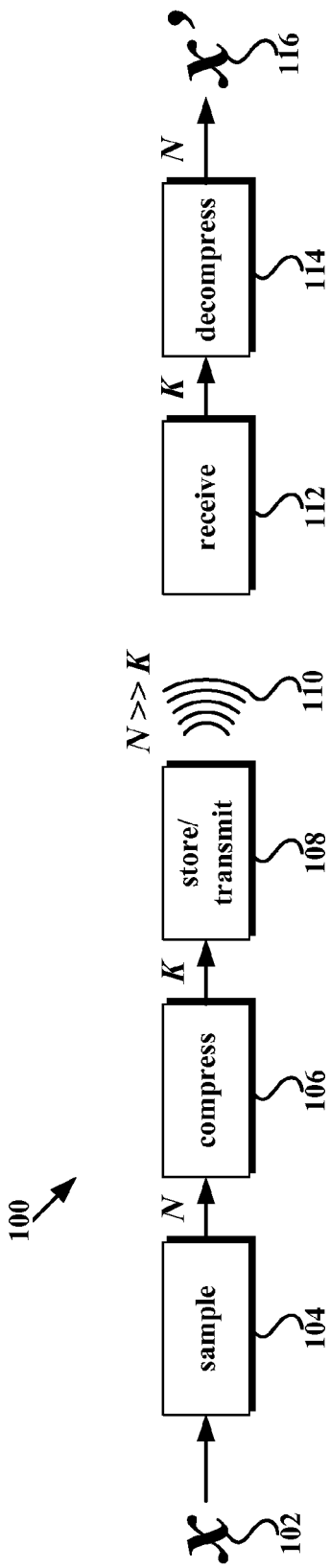
FIG. 1A depicts example signal transmission in a first example signal-acquisition system.

FIG. 1A depicts example signal transmission in a first example signal-acquisition system 100. Signal-acquisition system 100 generally depicts signal-acquisition based on Nyquist-rate sampling. Signal-acquisition system 100 includes an analog signal x 102, which is to be acquired. Analog signal x 102 is sampled at block 104 at the Nyquist rate N, or higher. The sampled signal is compressed at block 106 to a data rate K that is much less than Nyquist rate N. Then, at block 108 the compressed signal may be stored and/or transmitted by a transmitter, such as a wireless transmitter. Wireless signal 110 depicts the transmission of the compressed signal by block 108.

Wireless signal 110 may then be received at block 112. Block 112 may be, for example, a wireless receiver. At block 114, the compressed signal is decompressed from data rate K to the original sample rate (or Nyquist rate N). As such, block 114 may output analog signal x' 116, which is an approximation of analog signal x 102.

Figure 1B:
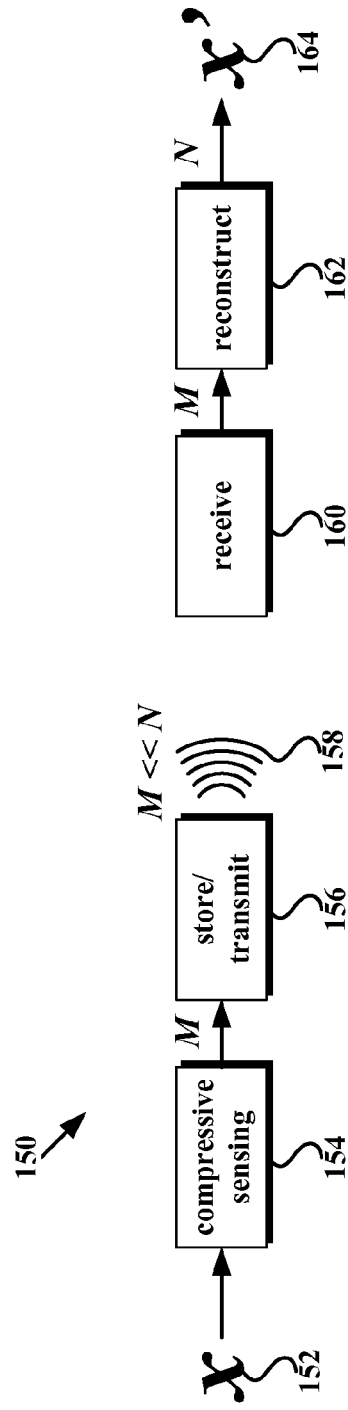
FIG. 1B depicts example signal transmission in a second example signal-acquisition system, in accordance with an embodiment.

FIG. 1B depicts example signal transmission in a second example signal-acquisition system 150, in accordance with an embodiment. Signal-acquisition system 150 generally depicts signal-acquisition based on compressive sensing. Signal-acquisition system 150 includes an analog signal x 152, which is to be acquired. Analog signal x 152 is compressed, prior to digitalization, at block 154. Analog signal x 152 may be compressed and represented by a vector containing M entries for a given period of time. As a general matter, M may be much less than the number of samples in the given period of time corresponding to Nyquist rate N. Then, at block 156 the compressed signal may be stored and/or transmitted by a transmitter, such as a wireless transmitter. Wireless signal 158 depicts the transmission of the compressed signal by block 156.

Wireless signal 158 may then be received at block 160. Block 160 may be, for example, a wireless receiver. At block 162, the compressed signal is reconstructed from vector form to a signal having a rate that is equal to Nyquist rate N. As such, block 162 may output analog signal x' 164, which is an approximation of analog signal x 152.

b. Compressed-Sensing Analog-to-Digital Conversion i. Compressed-Sensing Overview

Compressed sensing in signal acquisition and recovery exploits data redundancy arising from the significant difference between the rate of change of a sparse signal and the rate of information in it. As one example, many bio-signals exhibit such data redundancy characteristics. Compressed sensing is theoretically based on the matrix equation $[Y]=[\Phi][X]$; i.e., an uncompressed input data vector of size N, $[X]$, is multiplied by a measurement matrix $[\Phi]$ of size M×N to obtain the compressed output vector $[Y]$ of size M<N. A depiction of such a compressed sensing scheme is shown below as Equation 1.

$$\begin{pmatrix} y_1 \\ y_2 \\ \vdots \\ y_M \end{pmatrix} = \begin{pmatrix} \alpha_{11} & \cdots & \alpha_{1N} \\ \vdots & \ddots & \vdots \\ \alpha_{M1} & \cdots & \alpha_{MN} \end{pmatrix} \begin{pmatrix} x_1 \\ x_2 \\ \vdots \\ \vdots \\ x_M \end{pmatrix} \quad \text{Equation 1}$$

Those of skill in the art will appreciate that recovery of $[X]$ is possible with high probability, given that $M>K \log(N/K)$, where K is the number of non-zero entries in $[X]$. It should be noted that it may be desirable for the measurement matrix to possess Resctricted Isometry Property (RIP). Those of skill in the art will appreciate that RIP is a mathematical property that, if possessed by the measurement matrix, may help enable accurate reconstruction of $[X]$.

Once transmitted, $[Y]$ needs to be reconstructed to $[X]$ at the receiver. The reconstruction of $[X]$ lies in the solution of an under-defined (i.e., having many solutions) equation defined by $[Y]=[\Phi]^{-1}[X]$. Since $[\Phi]$ is not a square matrix, various algorithms may be applied to search for the right $[X]$ from several possible solutions. As those skilled in the art will appreciate, examples of such algorithms include: $L_1$-norm minimizations; matching pursuits; iterative thresholding; and total variation (TV) minimization.

ii. Compressed-Sensing Analog-to-Digital Conversion Architecture

One common approach to implementing Equation 1 is to use an analog delay line which effectively multiplies each row of $[\Phi]$ by $[X]$. However, there are many recognized limitations to this approach including, for example, potential inaccuracy and imprecision, power inefficiency, long delays, and large circuit areas. In at least these respects, row-wise multiplication of $[\Phi]$ by $[X]$ is undesirable.

Accordingly, the disclosure herein involves, inter alia, an improved column-by-column wise multiplication approach to. Advantages to such an approach include, for example, low-frequency operation, decreased power consumption, small circuit areas, and accuracy. Other advantages may exist as well. Such a column-wise multiplication enables an efficient compressed-sensing analog-to-digital conversion architecture.

Figure 2A:
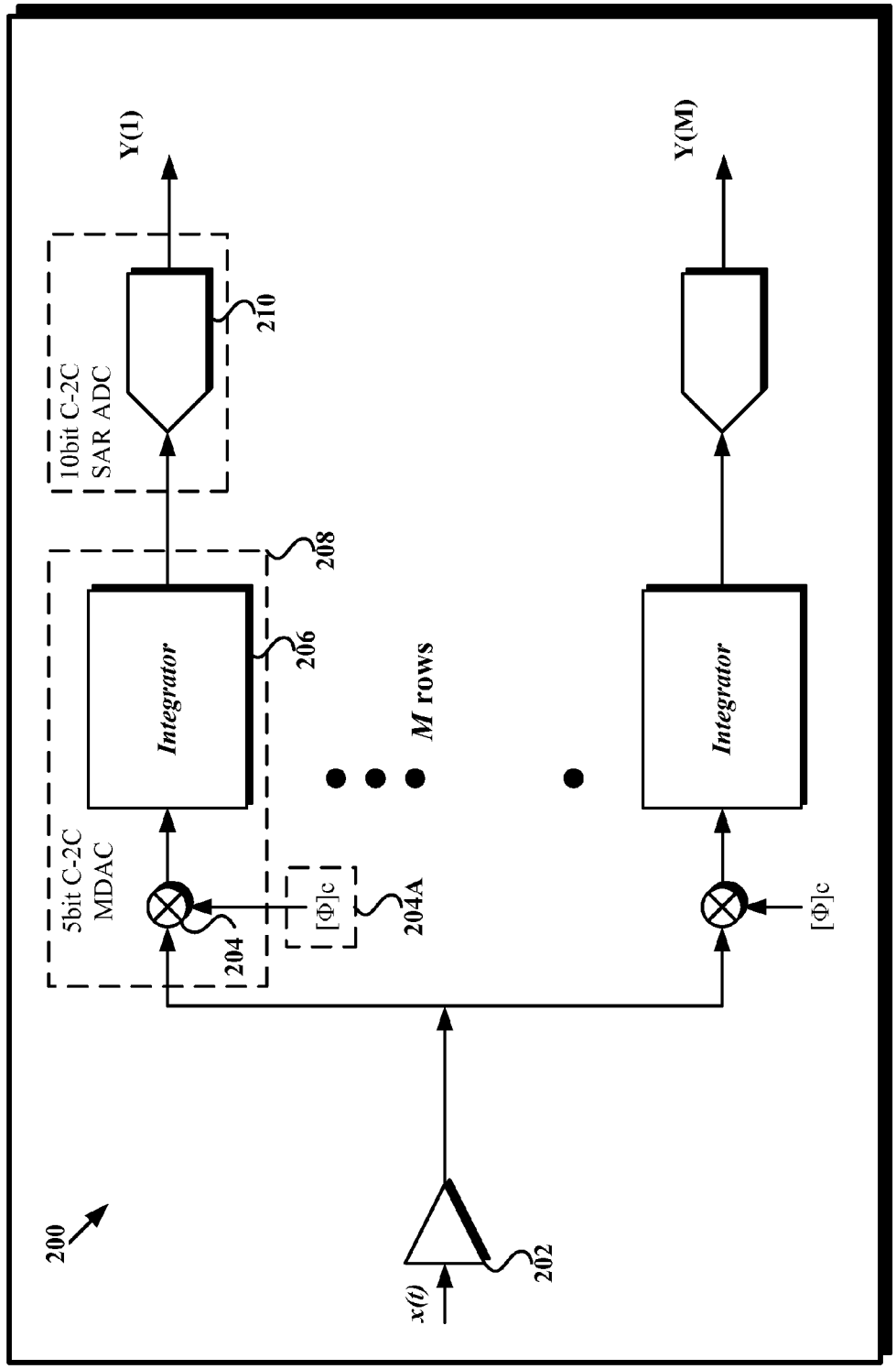
FIG. 2A depicts a first simplified block diagram of a compressed-sensing analog-to-digital conversion architecture, in accordance with an embodiment.

FIG. 2A depicts a first simplified block diagram of a compressed-sensing analog-to-digital conversion architecture 200, in accordance with an embodiment. Compressed-sensing analog-to-digital conversion architecture 200 may include low-noise amplifier 202, which may be configured to receive an analog input signal x(t) and provide amplified x(t) to multiplying digital-to-analog converter (MDAC) 208. It should be noted that although MDAC 208 is shown as a 5 bit C-2C MDAC, this is not necessary. Other examples of suitable DACs may exist as well.

MDAC 208 includes multiplication circuit 204 and integrator 206. Multiplication circuit 204 may be configured to multiply an input signal (such as amplified x(t)) with a measurement signal (such as $[\Phi]$) to produce a multiplied signal. As such, the measurement signal may include data from a column of a measurement matrix. Such a measurement matrix may include a number of entries, such as $$\begin{pmatrix} \alpha_{11} \\ \vdots \\ \alpha_{M1} \end{pmatrix}.$$

Measurement-matrix generator 204A may be coupled to multiplication circuit 204 and may be configured to generate a random coefficient, $[\Phi]_C$ for each entry in the measurement matrix.

Integration circuit 206 may be coupled to multiplication circuit 204 and may be configured to integrate the multiplied signal for a predefined amount of time to produce an integrated signal. In turn, compressed-sensing analog-to-digital conversion architecture 200 may also include analog-to-digital converter (ADC) 210 coupled to integration circuit 206. ADC 210 may be configured to sample the integrated signal and produce an output signal comprising at least one sample of the integrated signal. It should be noted that although ADC 210 is shown as a 10 bit C-2C successive approximation register (SAR) ADC, this is not necessary. Other examples of suitable ADCs may exist as well.

Compressed-sensing analog-to-digital conversion architecture 200 may include a number, M, of such combinations of multiplication circuit 204, integration circuit 206, and ADC 210. Each such combination may correspond to a column in the measurements matrix $[\Phi]$, having size M×N. As such, the output of each combination may correspond to an entry in the output vector $[Y]$.

Figure 2B:
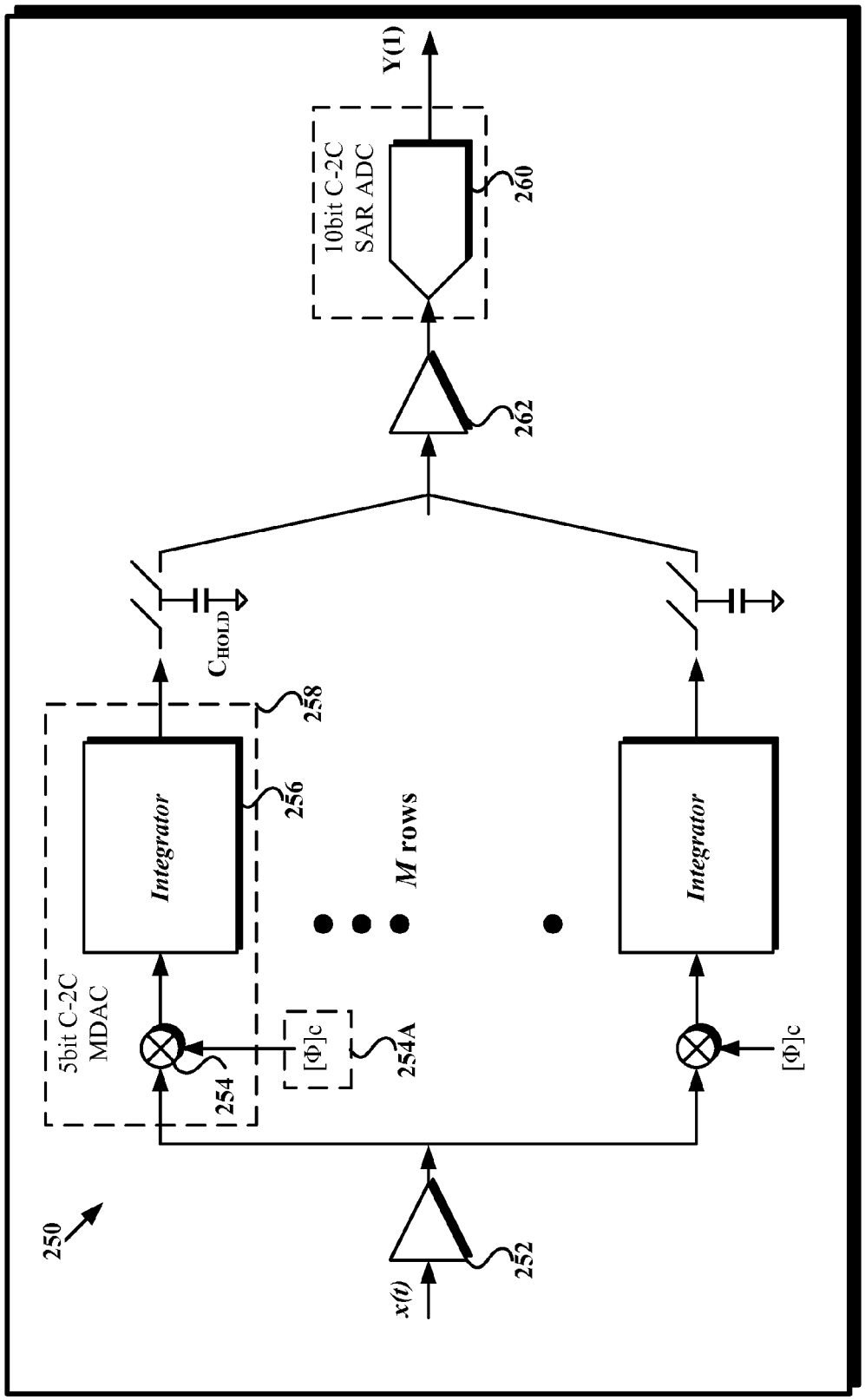
FIG. 2B depicts a second simplified block diagram of a compressed-sensing analog-to-digital conversion architecture, in accordance with an embodiment.

FIG. 2B depicts a second simplified block diagram of a compressed-sensing analog-to-digital conversion architecture 250, in accordance with an embodiment. Compressed-sensing analog-to-digital conversion architecture 250 may include LNA 252, MDAC 258, multiplication circuit 254, measurement-matrix generator 254A, and integration circuit 256. Each such element may be similar to, respectively, LNA 202, MDAC 208, multiplication circuit 204, measurement-matrix generator 204A, and integration circuit 206 of compressed-sensing analog-to-digital conversion architecture 200. Compressed-sensing analog-to-digital conversion architecture 250 may also include sampling buffer 262 configured to receive, from each MDAC circuit in a sequential manner, a respective output signal from each MDAC. In this way, the output of each integration circuit may be interleaved into a single output signal. A capacitor coupled to the output of integration circuit 256 may hold the output of integration circuit 256 for a complete time-frame, allowing SAR ADC 260 to operate at a lower frequency.

iii. Multiplication and Integration Circuits

As noted, multiplication circuit 204 may be coupled to measurement-matrix generator 204A. Some compressed-sensing analog-to-digital conversion architectures may implement a measurement-matrix generator using static random-access memory (SRAM) containing a high number of storage elements. Use of such SRAM comes at the cost of large area and power inefficiencies. To avoid such shortcomings, measurement-matrix generator 204A may include one or more linear feedback shift register(s) (LFSR) configured to generate the random coefficient $[\Phi]_C$ for each entry in the measurement matrix. Each random coefficient $[\Phi]_C$ generated by measurement-matrix generator 204A may be any suitable number of bits. As one example, a particular random coefficient $[\Phi]_C$ may be five bits, however, this is not necessary.

Figure 3:
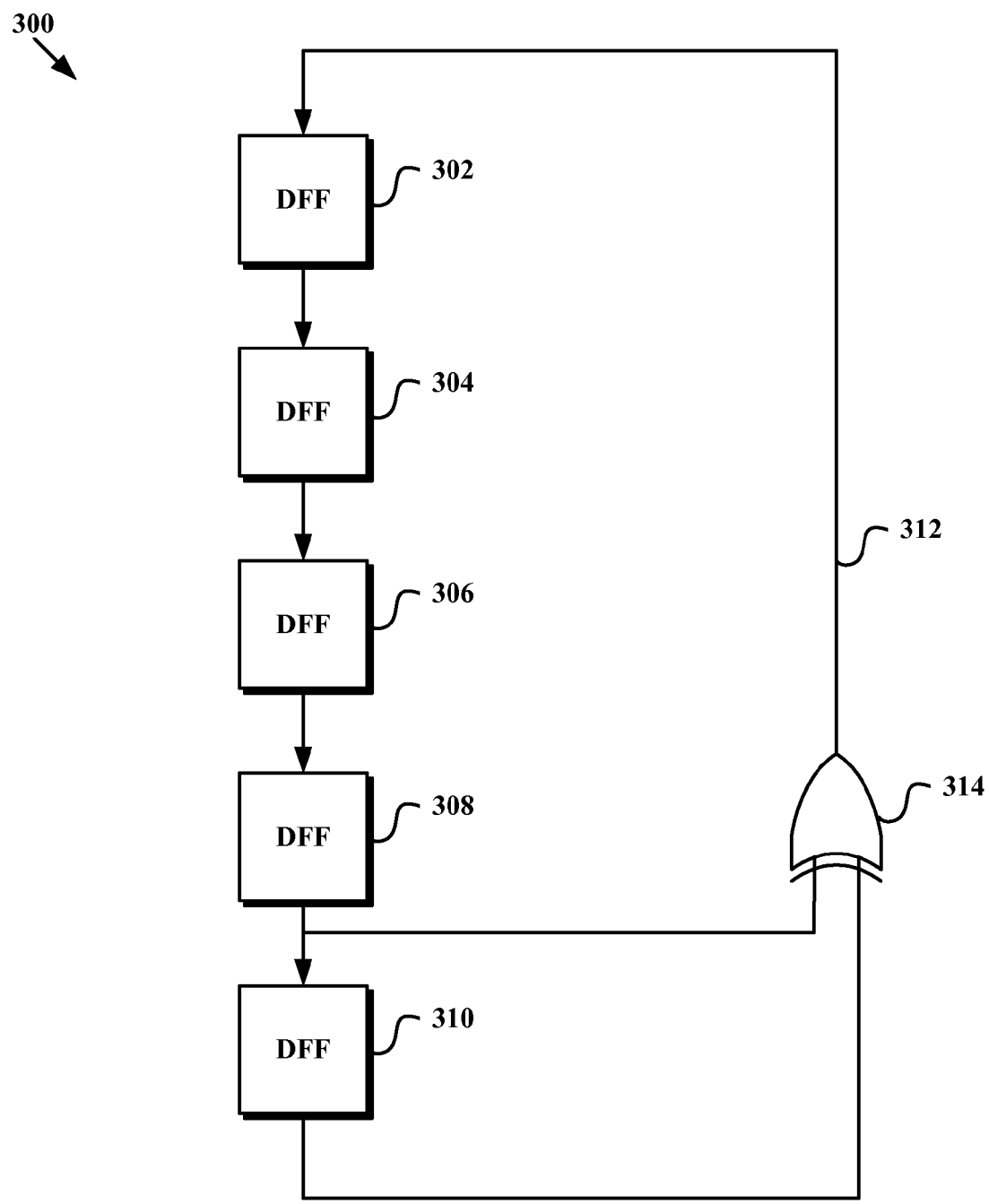
FIG. 3 depicts an example Fibonacci-type linear feedback shift register (LFSR), in accordance with an embodiment.

FIG. 3 depicts an example Fibonacci-type LFSR 300, in accordance with an embodiment. Those of skill in the art will appreciate that LFSRs include a number of stages, wherein each stage has a state, or value (e.g., a bit). One stage of such an LFSR is the input stage, and the state of the input stage is a linear function of a previous state of the LFSR.

A Fibonacci-type LFSR is characterized by one or more XOR-logic circuits having inputs that are coupled to one of at least one intermediate stage of the LFSR and the last, or output, stage of the LFSR. The result of the XOR function is then fed back into the input stage of the LFSR. Those of skill in the art will appreciate that the particular arrangement of XOR gates in a Fibonacci-type LFSR may be implemented such that the Fibonacci-type LFSR generates a maximum-length sequence. Such a maximum-length sequence is a type of pseudorandom binary sequence that is "maximum" in the sense that the state of the LFSR reproduces as infrequently as possible (i.e., they reproduce every binary sequence that can be reproduced by the shift register—for length-m registers they produce a sequence of length $2^m-1$ shifts in the register).

Returning now to FIG. 3, Fibonacci-type LFSR 300 is shown as a five-bit (or five-stage) LFSR that is realized by a set of five stages 302-310 connected in series. Each of stages 302-310 may be implemented as a d-type flip-flop, however other possibilities exist as well. Further, Fibonacci-type LFSR 300 includes a feedback path 312 from the output of XOR-logic circuit 314 to the input of stage 302. Feedback path 312 includes an XOR-logic circuit 314 having a first input that is coupled to an output of stage 308 and a second input that is coupled to an output of stage 310. Thus, as shown in FIG. 3, a five-bit LFSR may be realized by a set of five d-type flip-flops connected in series. It should be understood, however, that Fibonacci-type LFSR 300 is shown for purposes of example and explanation only, and should not be taken to be limiting.

Figure 4:
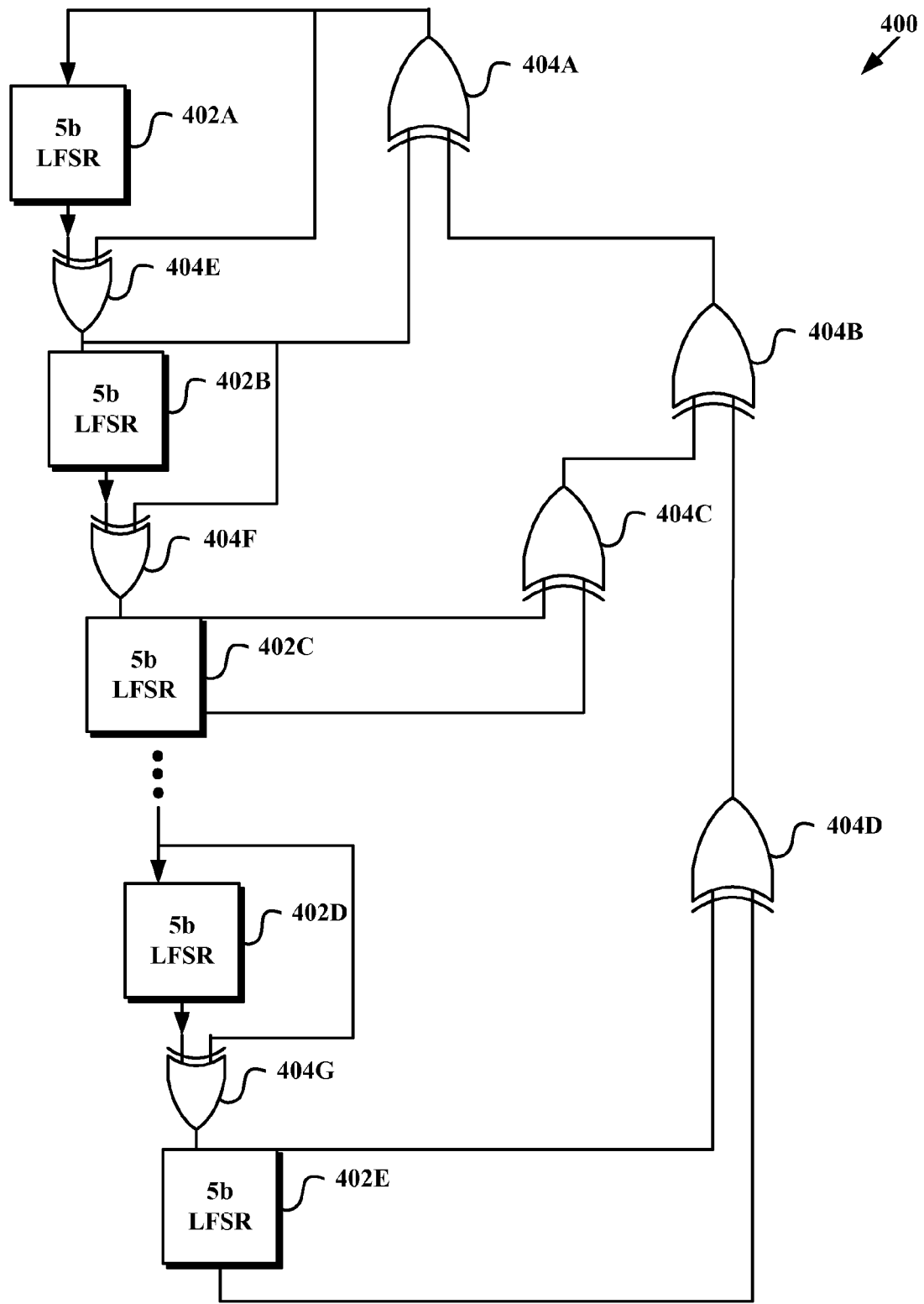
FIG. 4 depicts an example Galois with Fibonacci hybrid-LFSR, in accordance with an embodiment.

FIG. 4 depicts an example Galois with Fibonacci hybrid-LFSR 400, in accordance with an embodiment. As shown, hybrid-LFSR 400 may include a set of LFSRs 402A-402E. It should be understood that although each of LFSRs 402A-402E are shown as five-bit LFSRs, this is not necessary. Further, hybrid-LFSR 400 may include a set of XOR-logic circuits 404A-404G.

LFSRs 402A-402E may be combined such that a respective output of each LFSR is coupled to a respective input of another LFSR. Further, a respective output of each LFSR may be coupled to an input of a respective XOR-logic circuit, and a respective input of another LFSR may be coupled to the output of the respective XOR-logic circuit. As but one example, the output of LFSR 402B is coupled to an input of XOR-logic circuit 404F, and an input of LFSR 402C is coupled to the output of XOR-logic circuit 404F. Those of skill in the art will appreciate that such an arrangement of the forward path of hybrid-LSFR is commonly referred to as a Galois-type arrangement.

Similar to Fibonacci-type LFSR 300, hybrid-LFSR 400 includes one or more XOR-logic circuits having inputs that are coupled to each of at least one intermediate LFSR from set of LFSRs 402A-402E and the last, or output, LFSR from set of LFSRs 402A-402B. For example, XOR-logic circuits 404A-404D are implemented in the feedback path of hybrid-LFSR 400. Those of skill in the art will appreciate that the particular arrangement of XOR-logic circuits 404A-404D may be implemented such that hybrid-LFSR 400 generates a maximum-length sequence. That is, each of LFSRs 402A-402B may be understood to operate as a stage in hybrid-LFSR 400. Thus, in the case that hybrid-LFSR 400 includes eight LFSRs, and each such LFSR is five bits in length, hybrid-LFSR 400 may be understood to operate as a forty-bit LFSR.

Figure 5:
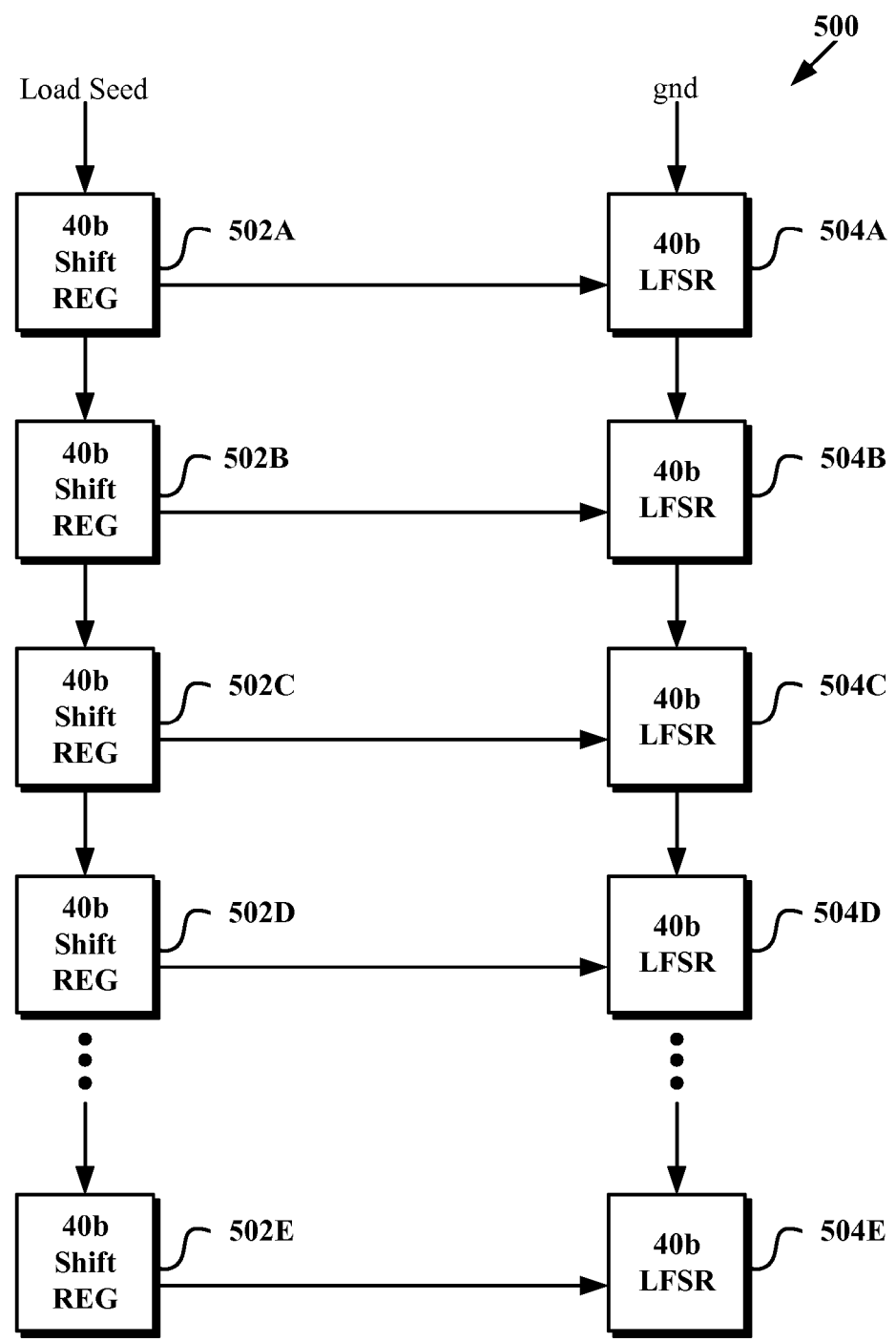
FIG. 5 depicts an example hybrid-LFSR based measurement-matrix generator, in accordance with an embodiment.

FIG. 5 depicts an example hybrid-LFSR based measurement-matrix generator 500, in accordance with an embodiment. Measurement-matrix generator 500 includes multiple hybrid-LFSRs 504A-504E. Each of hybrid-LFSRs 504A-504E may be a forty-bit LFSR, such as hybrid-LFSR 400 described above, although this is not necessary. Accordingly, measurement-matrix generator 500 may include multiple sets of LFSRs (e.g., each of hybrid-LFSRs 504A-504E). Further, each set of LFSRs may be configured to generate the random coefficient for an entry in the measurement matrix. That is, the state of a given stage of a given hybrid-LFSR may be taken as a random coefficient $[\Phi]_C$ for an entry in the measurement matrix, as discussed above.

Measurement-matrix generator 500 also includes multiple shift registers 502A-502E. As a general matter, shift registers 502A-502E may be of the same length as each of hybrid-LFSRs 504A-504E (which may be forty bits in accordance with forty-bit hybrid-LFSRs 504A-504E, although this is not necessary). In this way, each of shift registers 502A-502E may be used to load a respective one of hybrid-LFSRs 504A-504E. In an embodiment, eight shift registers, such as shift registers 502A-502E, and eight hybrid-LFSRs, such as hybrid-LFSRs 504A-504E, may be implemented, although this is not necessary.

The particular embodiment of a measurement-matrix generator depicted in FIG. 5, therefore, may provide 64 rows of five-bit measurement matrix coefficients. In doing so, the measurement-matrix generator makes use of both Fibonacci and Galois topologies to achieve a uniform random measurement matrix. Those of skill in the art will appreciate that using one bit out of every five bit LFSR can result in a Bernoulli random measurement matrix. Those of skill in the art will also appreciate that although FIGS. 3-5 depict particular examples of certain circuits and/or other components, such examples should not be taken to be limiting. Other examples and embodiments of a measurement-matrix generator implemented in accordance with the principles disclosed herein may be possible as well.

Figure 6:
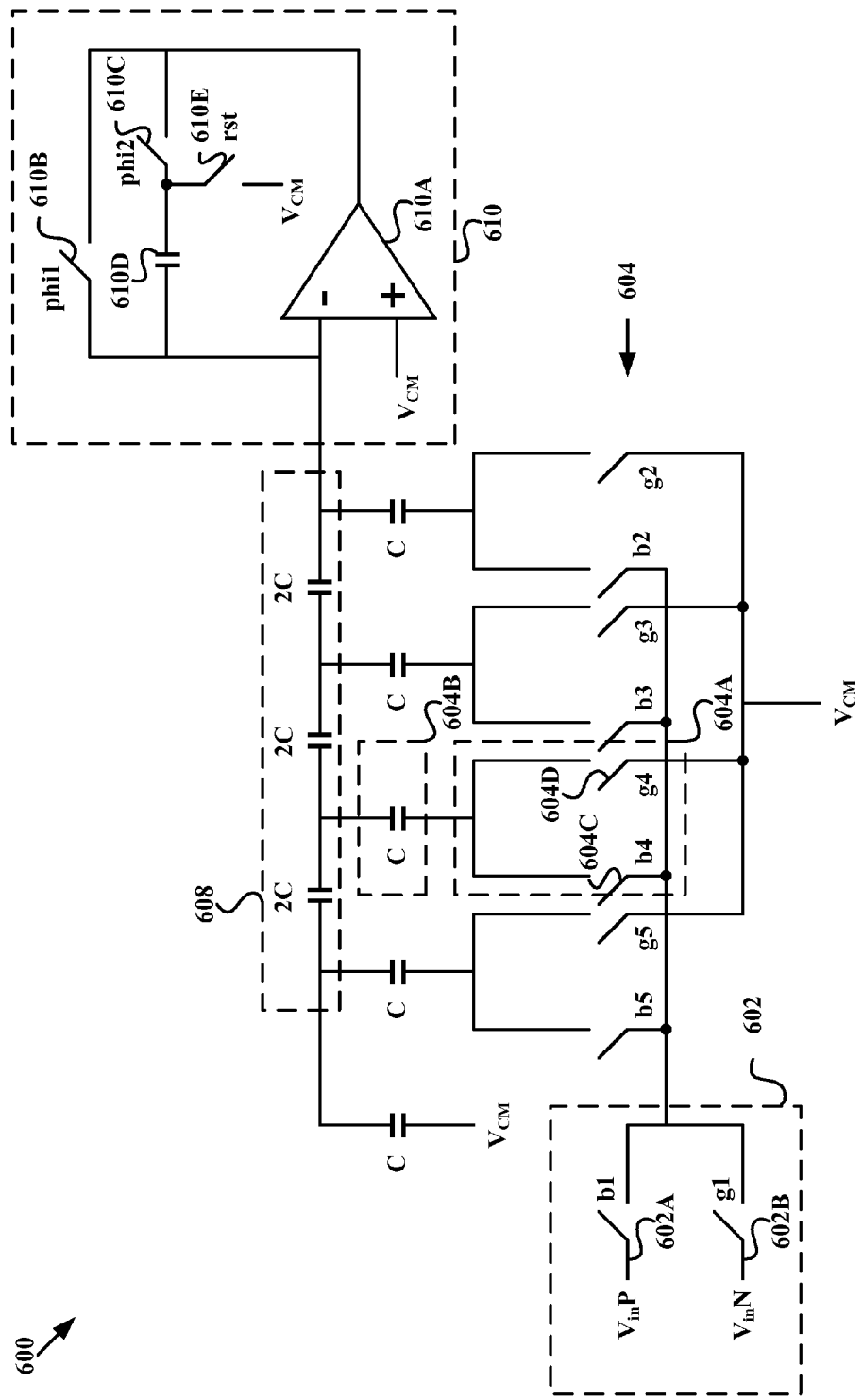
FIG. 6 depicts an example C-2C switched capacitor multiplying digital-to-analog converter circuit, in accordance with an embodiment.

Returning now to FIG. 2A, multiplication circuit 204 may take many forms. One example of multiplication circuit 204 is shown in FIG. 6. FIG. 6 depicts an example C-2C switched capacitor multiplying digital-to-analog converter (MDAC) circuit (multiplication circuit 600), in accordance with an embodiment. While FIG. 6 provides a particular example of a multiplication circuit, it should be understood that other examples may be possible as well.

Multiplication circuit 600 includes differential-signal selection circuit 602, analysis circuit 604 including multiple stages that each include circuit elements such as selection circuit 604A and storage element 604B, as well as combination circuit 608. Multiplication circuit 600 may operate, at least in part, according to non-overlapping clock signals phi1 and phi2, as will be discussed further below.

Multiplication circuit 600 may be configured to receive an input signal, such as input signal x(t) described above with respect to FIG. 2A. In an embodiment, the input signal may include a differential-input signal having a positive-input signal ($V_{in}P$) and a negative-input signal ($V_{in}N$). That is, the positive-input signal may be an inverse of the negative-input signal.

Differential-signal selection circuit 602 may include a switch configured to select one of the positive-input signal and the negative-input signal based at least in part on the measurement signal, or measurement matrix [Φ]. For example, first switch 602A may be configured to receive $V_{in}P$ and may operate according to switch-signal b1, where b1 may be equal to the inverse of c1 (the first coefficient of coefficients c1-c5 of a five-bit measurement matrix [Φ]). On the other hand, second switch 602B may be configured to receive $V_{in}N$ and may operate according to switch-signal g1, where g1 may be equal to c1. In this way, first switch 602A and second switch 602B may never be closed (or open) at the same time, and accordingly, multiplication circuit 600 may receive only one of the positive-input signal and the negative-input signal at a given time.

Analysis circuit 604 may be coupled to differential-signal selection circuit 602, and as noted, may include a plurality of stages, each stage including circuit elements such as selection circuit 604A and storage element 604B. Selection circuit 604A may be configured to select, based at least in part on the measurement signal, or measurement matrix [Φ], one of (a) the positive-input signal or the negative-input signal selected by differential-signal selection circuit 602 and (b) a virtual-ground signal. For example, first switch 604C may be configured to receive the selected one of the positive-input signal and the negative-input signal from differential-signal selection circuit 602, and may operate according to switch signal b4, where, for b2-b5, $b_i = \overline{c_i}$ AND phi1. On the other hand, second switch 604D may be configured to receive the virtual-ground signal, and may operate according to switch signal g4, where, for g2-g5, $g_i = \overline{c_i}$ AND phi1 OR phi2. In this way, first switch 604C and second switch 604D may never be closed (or open) at the same time, and accordingly, selection circuit 604A may only select one of (a) the positive-input signal or the negative-input signal selected by differential-signal selection circuit 602 and (b) a virtual-ground signal, at a time.

Those of skill in the art will appreciate that to implement a Bernoulli random measurement matrix, entries $c_2$-$c_5$ will maintain a value of 1, and entry $c_1$ will vary between the values of 0 and 1. Note that in the case of implementation of a Bernoulli random measurement matrix, the architecture of the analysis circuit simplifies to a stage that contains a single capacitor.

Storage element 604B may have (a) a first terminal configured to receive the signal selected by selection circuit 604A and (b) a second terminal configured to output a selected-output signal. In some embodiments, storage element 604B may be a capacitor, however this is not necessary. Those of skill in the art will appreciate that storage element 604B may be configured to charge according to the voltage of the signal selected by selection circuit 604A.

Combination circuit 608 may be configured to combine the selected-output signals of plurality of stages 604 and thereby generate the multiplied signal. Combination circuit 608 may include a set of capacitors. For purposes of explanation, the capacitors present in analysis circuit 604 may be referred to as first capacitors, and the capacitors present in combination circuit 608 may be referred to as second capacitors. In some embodiments, the first capacitors may each have a first capacitance. Further, each second capacitor may have a capacitance that is approximately twice the first capacitance. Further still, a first terminal of each second capacitor may coupled to a first stage and a second terminal of each second capacitor is coupled to a second stage. The coupling of each second capacitor to each of the first stage and the second stage may be implemented by coupling the second capacitor to the respective first capacitor of each stage.

Returning now to FIG. 2A, integration circuit 206 may take many forms, including that depicted with respect to integration circuit 610 in FIG. 6. In an embodiment, combination circuit 608 may be coupled to integration circuit 610. More specifically, integration circuit 610 may include operational-amplifier circuit 610A. Operational-amplifier circuit 610A may include a first input configured to receive the multiplied signal generated by combination circuit 608 and may include a second input configured to receive a virtual-ground signal. Operational-amplifier circuit 610A may also include an output coupled to a first feedback path connected to the first input and a second feedback path connected to the first input. The first feedback path may include a first-feedback switch 610B configured to operate according to non-overlapping clock signal phi1. The second feedback path may include a second-feedback switch 610C configured to operate according to non-overlapping clock signal phi2, a feedback capacitor 610D, and a reset switch 610E.

In this way, during phi1, the voltage of the multiplied signal generated by combination circuit 608 is fed back to the first input of operational-amplifier circuit 610A. Then, during phi2, the voltage at the first input, including the feedback, will be applied to capacitor 610D. In other words, the multiplied signal is integrated for a predefined amount of time (reflected by phi1), and an integrated signal is produced at capacitor 610D by charging capacitor 610D in accordance with phi2.

iv. Successive Approximation Register Analog-to-Digital Converter Circuit

Figure 7:
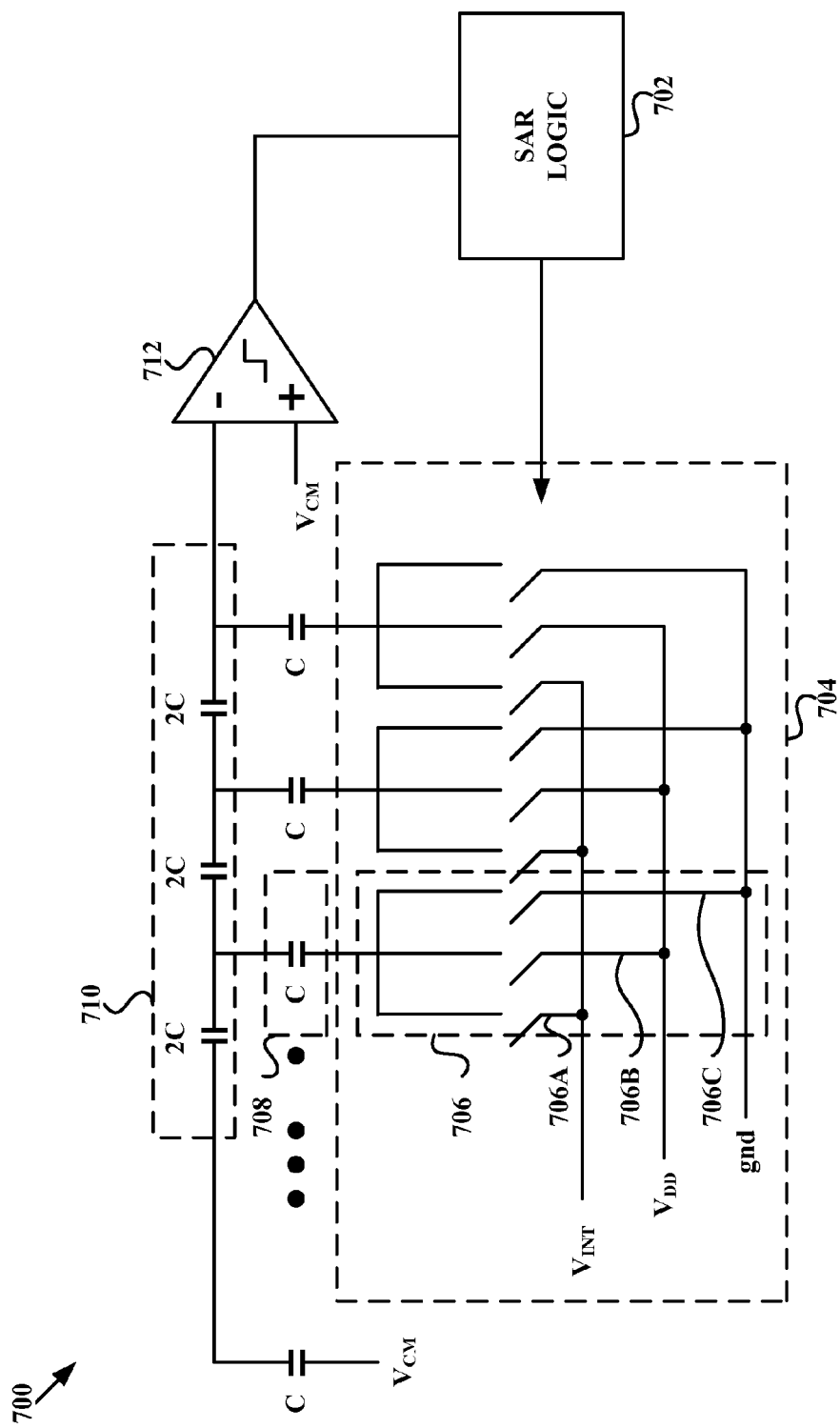
FIG. 7 depicts an example successive approximation register (SAR) analog-to-digital conversion circuit, in accordance with an embodiment.

Returning now to FIG. 2A, integration circuit 208 may be coupled to analog-to-digital converter (ADC) circuit 210. One example of ADC circuit 210 is depicted in FIG. 7, which depicts an example successive approximation (SAR) ADC circuit 700, in accordance with an embodiment. While FIG. 7 provides a particular example of an SAR ADC circuit, it should be understood that other examples may be possible as well.

SAR ADC circuit 700 may include a SAR-logic circuit 702, sampling circuit 704 including multiple stages that each include circuit elements such as selection circuit 706 and storage element 708, combination circuit 710, as well as comparator circuit 712.

SAR ADC circuit 700 may be configured to receive signals, such as the integrated signal ($V_{INT}$) produced by integration circuit 610. SAR ADC circuit 700 may also be configured to receive a non-zero direct-current signal ($V_{DD}$), and a ground signal (gnd).

Those of skill in the art will appreciate that SAR-logic circuit 702 may be used to control switching by sampling circuit 704 between signals such as $V_{INT}$, $V_{DD}$, and gnd by way of a selection signal. As noted, sampling circuit 706 may include a plurality of stages, each stage including circuit elements such as selection circuit 706 and storage element 708. Selection circuit 706 may be configured to select, based at least in part on the selection signal provided by SAR-logic circuit 702, one of (a) the integrated signal ($V_{INT}$), (b) a direct-current signal ($V_{DD}$), and (c) a ground signal (gnd). For example, first switch 706A may be configured to receive $V_{INT}$. Alternatively, second switch 706B may be configured to receive $V_{DD}$. And third switch 706C may be configured to receive gnd. SAR-logic circuit 702 may be configured such that none of first switch 706A, second switch 706B, and third switch 706C are closed at the same time. Accordingly, sampling circuit 706 may only select one of (a) the integrated signal ($V_{INT}$), (b) a direct-current signal ($V_{DD}$), and (c) a ground signal (gnd), at a time.

Storage element 708 may have (a) a first terminal configured to receive the signal selected by selection circuit 706 and (b) a second terminal configured to output a selected-output signal. In some embodiments, storage element 708 may be a capacitor, however this is not necessary. Those of skill in the art will appreciate that storage element 708 may be configured to charge according to the voltage of the signal selected by selection circuit 706.

Combination circuit 710 may be configured to combine the selected-output signals of the plurality of stages and thereby generate a combined-output signal. Combination circuit 710 may include a set of capacitors. For purposes of explanation, the capacitors present in sampling circuit 704 may be referred to as first capacitors, and the capacitors present in combination circuit 710 may be referred to as second capacitors. In some embodiments, the first capacitors may each have a first capacitance. Further, each second capacitor may have a capacitance that is approximately twice the first capacitance. Further still, a first terminal of each second capacitor may be coupled to a first stage and a second terminal of each second capacitor is coupled to a second stage. The coupling of each second capacitor to each of the first stage and the second stage may be implemented by coupling the second capacitor to the respective first capacitor of each stage.

Comparator circuit 712 may be configured to receive the combined-output signal and drive SAR-logic circuit 702 using its output. Accordingly, SAR ADC circuit 700 may achieve an efficient and accurate quantization of the integrated signal produced by integration circuit 610. Comparator circuit 712 may include a first input configured to receive the combined-output signal, a second input configured to receive a virtual-ground signal, and an output configured to output the output signal.

Figure 8:
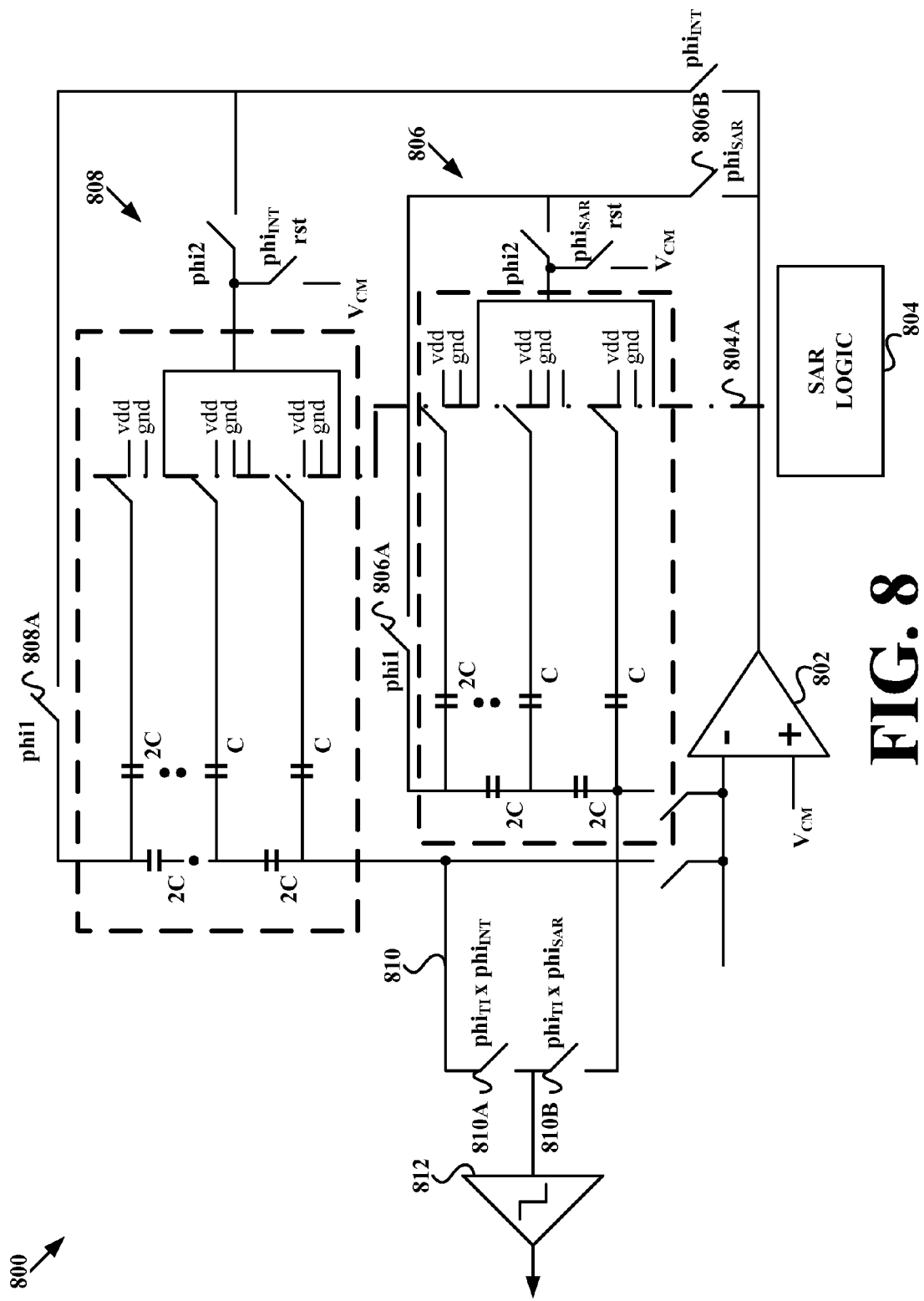
FIG. 8 depicts an example integration circuit that includes SAR analog-to-digital conversion circuits, in accordance with an embodiment.

FIG. 8 depicts an example integration circuit 800 that includes SAR analog-to-digital conversion circuits, in accordance with an embodiment. In some respects, the arrangement shown in FIG. 8 moves the functionality of SAR ADC circuit 700 depicted in FIG. 7 into integration circuit 610 as depicted in FIG. 6.

In an embodiment, combination circuit 608 may be coupled to integration circuit 800. More specifically, integration circuit 800 may include operational-amplifier circuit 802. Operational-amplifier circuit 802 may include a first input configured to receive the multiplied signal generated by combination circuit 608 and may include a second input configured to receive a virtual-ground signal.

Integration circuit 800 may also include SAR-logic circuit 804, which may be used to control sub-integration circuits 806 and 808 via selection signal 804A. Operational-amplifier circuit 802 may include an output coupled to a first feedback path connected to the first input and a second feedback path connected to the first input. The first feedback path may include a first-feedback switch 806A configured to operate according to non-overlapping clock signal phi1 and second-feedback switch 806B configured to operate according to SAR-logic clock signal $phi_{SAR}$. The first feedback patch may also include first sub-integration circuit 806, which may have an arrangement that is generally similar to SAR ADC circuit 700 described above with respect to FIG. 7. More particularly, sub-integration circuit 806 may include a plurality of stages, where each stage is configured to provide a first-sub-integration selected-output signal. Sub-integration circuit 806 may also include a first combination circuit configured to combine the first-sub-integration selected-output signals of the plurality of stages and thereby generate a first combined-output signal. The first feedback path may also include a reset switch that operates according to $phi_{SAR}$.

The second feedback path may include a first-feedback switch 808A configured to operate according to non-overlapping clock signal phi1 and second-feedback switch 808B configured to operate according to integration clock signal $phi_{INT}$. The second feedback patch may also include second sub-integration circuit 808, which may have an arrangement that is generally similar to SAR ADC circuit 700 described above with respect to FIG. 7. More particularly, second sub-integration circuit 808 may include a plurality of stages, where each stage is configured to provide a second-sub-integration selected-output signal. Sub-integration circuit 808 may also include a second combination circuit configured to combine the second-sub-integration selected-output signals of the plurality of stages and thereby generate a second combined-output signal. The second feedback path may also include a reset switch that operates according to $phi_{INT}$.

Note that using two feedback paths provides for direct sampling of the multiplied signal onto a SAR ADC, thus eliminating the need for a sampling buffer. Further note that while one feedback path is used for integration, the other feedback path is used for digitization, in a time-interleaved manner.

Integration circuit 800 may also include a combined-output-signal selection switch 810 configured to select one of the first combined-output signal generated by first sub-integration circuit 806 and the second combined-output signal generated by second sub-integration circuit 808. Integration circuit 800 may also include comparator circuit 812 configured to receive the selected one of the first combined-output signal and the second combined-output signal.

For example, first switch 810A may be configured to receive the second combined-output signal and may operate according to time-interleaved clock signal $phi_{TI}$ AND $phi_{INT}$. On the other hand, second switch 810B may be configured to receive first combined-output signal and may operate according to $phi_{TI}$ AND $phi_{SAR}$. In this way, first switch 810A and second switch 810B may never be closed (or open) at the same time, and accordingly, comparator circuit 812 may receive only one of the first combined-output signal and the second combined-output signal at a given time.

II. EXAMPLE METHOD

Figure 9:
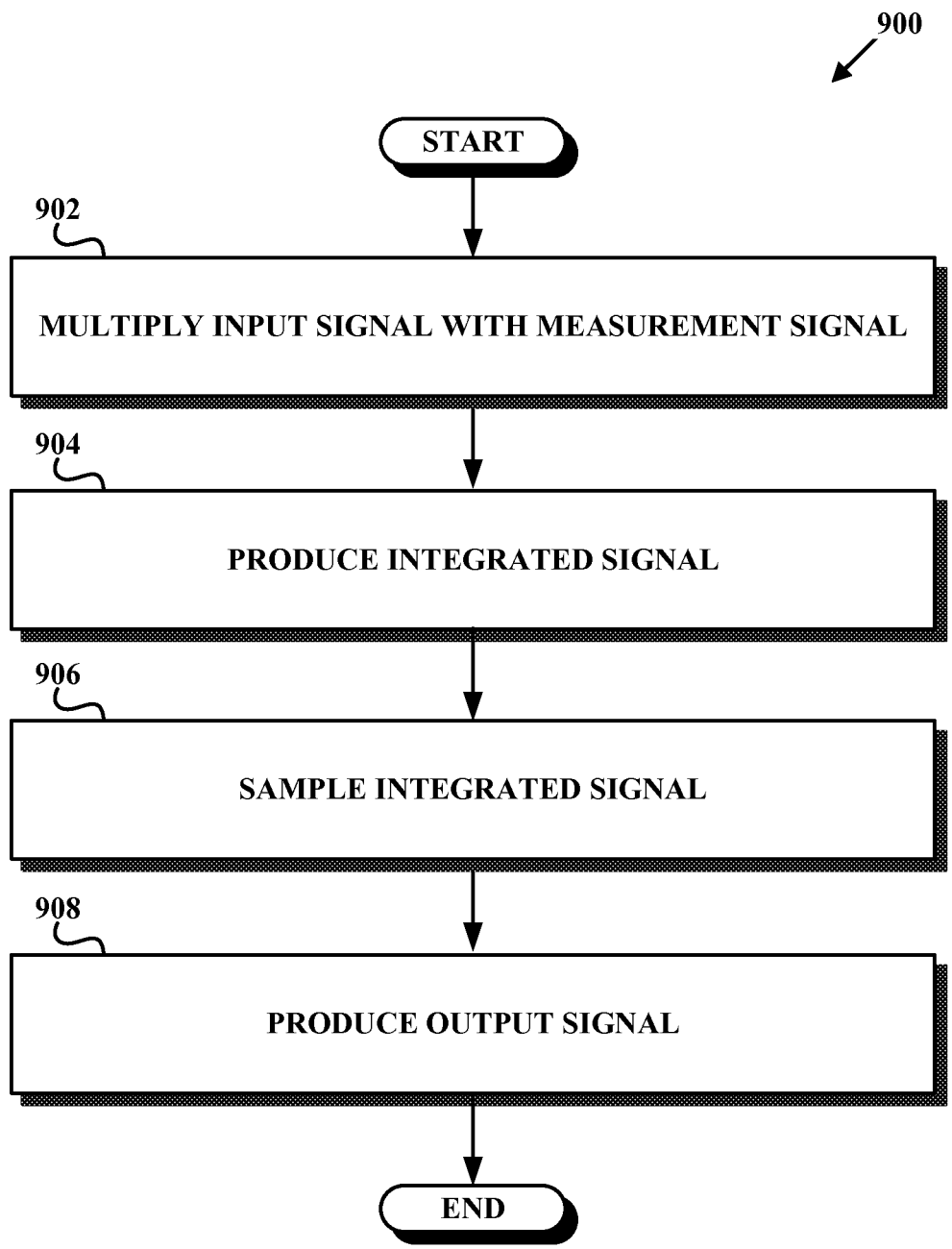
FIG. 9 depicts an example method for compressed sensing analog to digital conversion, in accordance with an embodiment.

FIG. 9 depicts an example method 900 for compressed sensing analog to digital conversion, in accordance with an embodiment. Method 900 may be carried out by any suitable compressed-sensing circuit, including, but not limited to, the various compressed-sensing circuitry described herein. As shown in FIG. 9, method 900 begins at step 902 where the compressed-sensing circuitry multiplies an input signal with a measurement signal to produce a multiplied signal. The measurement signal may include data from a column of a measurement matrix. Further, the measurement signal may be generated by a measurement-matrix generator as described above.

At step 904, the compressed-sensing circuitry integrates the multiplied signal for a predefined amount of time to produce an integrated signal. Such integration may be performed in accordance with the description of the integration circuitry depicted in at least FIGS. 6 and/or 8 above. Other examples may exist as well.

At step 906, the compressed-sensing circuitry samples the integrated signal. And at step 908, the compressed-sensing circuitry produces an output signal that includes at least one sample of the integrated signal. The sampling and production of the output signal may be performed in accordance with the description of the successive approximation logic analog-to-digital converter circuitry depicted in at least FIGS. 7 and/or 8 above. Other examples may exist as well.

II. CONCLUSION

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

We claim:

1. A circuit comprising:
a multiplication circuit configured to multiply an input signal with a measurement signal to produce a multiplied signal, wherein the measurement signal comprises data from a column of a measurement matrix, wherein the measurement-matrix comprises a plurality of entries;
a measurement-matrix generator coupled to the multiplication circuit, wherein the measurement-matrix generator is configured to generate a random coefficient for each entry in the measurement matrix;
an integration circuit coupled to the multiplication circuit and configured to integrate the multiplied signal for a predefined amount of time to produce an integrated signal; and
an analog to digital converter (ADC) circuit coupled to the integration circuit and configured to (i) sample the integrated signal and (ii) produce an output signal comprising at least one sample of the integrated signal.

2. The circuit of claim 1, wherein the measurement-matrix generator comprises a linear feedback shift register (LFSR) configured to generate the random coefficient for each entry in the matrix.

3. The circuit of claim 1, wherein the measurement-matrix generator comprises multiple sets of linear feedback shift registers (LFSRs), wherein each set of LFSRs is configured to generate the random coefficient for an entry in the measurement matrix.

4. The circuit of claim 3, wherein each LFSR comprises (a) a set of d-type flip-flops connected in series and (b) a feedback path, wherein the feedback path comprises at least one XOR-logic circuit.

5. The circuit of claim 3, wherein the multiple sets of LFSRs comprises eight sets of LFSRs, each including eight five-bit LFSRs.

6. The circuit of claim 5, wherein each of the eight sets of LFSRs is coupled to a forty-bit shift register.

7. The circuit of claim 3, wherein the LFSRs are combined in a Galois-type arrangement.

8. The circuit of claim 7, wherein the multiplication circuit comprises a differential-signal selection circuit having a switch configured to select one of a positive-input signal and a negative-input signal based at least in part on a coefficient of the measurement matrix.

9. The circuit of claim 8, wherein the multiplication circuit further comprises an analysis circuit comprising:
a plurality of stages, each stage comprising:
a selection circuit configured to select, based at least in part on the coefficient of the measurement matrix, one of (a) the selected one of the positive-input signal and the negative-input signal and (b) a virtual-ground signal; and
a storage element having (a) a first terminal configured to receive the signal selected by the selection circuit and (b) a second terminal configured to output a selected-output signal; and
a combination circuit configured to combine the selected-output signals of the plurality of stages and thereby generate the multiplied signal.

10. The circuit of claim 9, wherein:
the integration circuit comprises an operational-amplifier circuit comprising:
a first input configured to receive the multiplied signal;
a second input configured to receive the virtual-ground signal; and
an output coupled to a first feedback path connected to the first input and a second feedback path connected to the first input, wherein the first feedback path comprises a first-feedback switch, and wherein the second feedback path comprises a second-feedback switch, a feedback capacitor, and a reset switch; and
wherein the combination circuit comprises a set of second capacitors, wherein each second capacitor has a capacitance that is approximately twice the first capacitance, and wherein a first terminal of each second capacitor is coupled to a first stage and a second terminal of each second capacitor is coupled to a second stage.

11. The circuit of claim 7, wherein the combination of LFSRs generates a maximum-length sequence.

12. The circuit of claim 7, wherein each LFSR is a Fibonacci-type LFSR.

13. The circuit of claim 1, wherein the ADC circuit comprises:
a successive approximation register (SAR)-logic circuit configured to output a selection signal;
a sampling circuit comprising a plurality of stages, each stage comprising:
a selection circuit configured to select, based at least in part on the selection signal, one of (a) the integrated signal, (b) a direct-current signal, and (c) a ground signal; and
a storage element having (a) a first terminal configured to receive the signal selected by the selection circuit and (b) a second terminal configured to output a selected-output signal; and
a combination circuit configured to combine the selected-output signals of the plurality of stages and thereby generate a combined-output signal.

14. The circuit of claim 1, wherein the circuit further comprises:
a set of ADC circuits, wherein each ADC circuit is coupled to a respective integration circuit, and wherein each integration circuit is coupled to a respective multiplication circuit;
a sampling buffer configured to receive, from each ADC circuit in a sequential manner, a respective output signal;
a successive approximation register (SAR)-logic circuit configured to output a selection signal;
a sampling circuit comprising a plurality of stages, each stage comprising:
a selection circuit configured to select, based at least in part on the selection signal, one of (a) the integrated signal, (b) a direct-current signal, and (c) a ground signal; and a storage element having (a) a first terminal configured to receive the signal selected by the selection circuit and (b) a second terminal configured to output a selected-output signal; and a combination circuit configured to combine the selected-output signals of the plurality of stages and thereby generate a combined-output signal.

15. The circuit of claim 1, wherein the integration circuit comprises an operational-amplifier circuit comprising:
a first input configured to receive the multiplied signal;
a second input configured to receive the virtual-ground signal;
a successive approximation register (SAR)-logic circuit; and
an output coupled to a first feedback path connected to the first input, wherein the first feedback path comprises:
a first sub-integration circuit comprising a plurality of stages, each stage configured to provide a first-sub-integration selected-output signal; and
a first combination circuit configured to combine the first-sub-integration selected-output signals of the plurality of stages and thereby generate a first combined-output signal; and
an output coupled to a second feedback path connected to the first input, wherein the second feedback path comprises:
a second sub-integration circuit comprising a plurality of stages, each stage configured to provide a second-sub-integration selected-output signal; and
a second combination circuit configured to combine the second-sub-integration selected-output signals of the plurality of stages and thereby generate a second combined-output signal.

16. The circuit of claim 1, wherein the multiplication of the input signal with the measurement signal is performed column-by-column.

17. The circuit of claim 1, wherein the measurement-matrix generator includes both Fibonacci and Galois topologies.

18. A circuit comprising:
a multiplication circuit configured to multiply an input signal with a measurement signal to produce a multiplied signal, wherein the measurement signal comprises data from a column of a measurement matrix, wherein the measurement matrix comprises a plurality of entries; and
a measurement-matrix generator coupled to the multiplication circuit and configured to generate a random coefficient for each entry in the measurement matrix.

19. The circuit of claim 18, wherein the multiplication circuit is a switched capacitor circuit.

20. A circuit comprising:
a set of analog to digital converter (ADC) circuits, wherein each ADC circuit is coupled to a respective integration circuit, wherein each integration circuit is coupled to a respective multiplication circuit, wherein the multiplication circuit is configured to multiply a random coefficient and an input signal to produce a multiplied signal, and wherein the integration circuit is configured to integrate the multiplied signal to produce an integrated signal;

a sampling buffer configured to receive, from each ADC circuit in a sequential manner, a respective output signal;
a successive approximation register (SAR)-logic circuit configured to output a selection signal;
a sampling circuit comprising a plurality of stages, each stage comprising:
a selection circuit configured to select, based at least in part on the selection signal, one of (a) the integrated signal, (b) a direct-current signal, and (c) a ground signal; and
a storage element having (a) a first terminal configured to receive the signal selected by the selection circuit and (b) a second terminal configured to output a selected-output signal; and
a combination circuit configured to combine the selected-output signals of the plurality of stages and thereby generate a combined-output signal.

21. A circuit comprising an operational-amplifier circuit, the operational-amplifier circuit comprising:
a first input configured to receive an input signal;
a second input configured to receive a virtual-ground signal;
an operational amplifier configured to produce an output signal based on the first input and the second input; and
a successive approximation register (SAR)-logic circuit,
wherein the output signal is coupled to a first feedback path, wherein the first feedback path is connected to the first input, and wherein the first feedback path comprises:
a first sub-integration circuit comprising a plurality of stages, each stage configured to provide a first-sub-integration selected-output signal; and
a first combination circuit configured to combine the first-sub-integration selected-output signals of the plurality of stages and thereby generate a first combined-output signal; and
wherein the output signal is coupled to a second feedback path, wherein the second feedback path is connected to the first input, and wherein the second feedback path comprises:
a second sub-integration circuit comprising a plurality of stages, each stage configured to provide a second-sub-integration selected-output signal; and
a second combination circuit configured to combine the second-sub-integration selected-output signals of the plurality of stages and thereby generate a second combined-output signal.

22. A method comprising:
multiplying an input signal with a measurement signal to produce a multiplied signal, wherein the measurement signal comprises data from a column of a measurement matrix, wherein the measurement matrix comprises a plurality of entries;
generating a random coefficient for each entry in the measurement matrix;
integrating the multiplied signal for a predefined amount of time to produce an integrated signal;
sampling the integrated signal; and
producing an output signal comprising at least one sample of the integrated signal.

* * * * *